United States Patent [19]
Chevallier

[11] Patent Number: 6,020,775
[45] Date of Patent: *Feb. 1, 2000

[54] ADJUSTABLE TIMER CIRCUIT

[75] Inventor: Christophe J. Chevallier, Palo Alto, Calif.

[73] Assignee: Micron Technology, Inc., Boise, Id.

[ * ] Notice: This patent is subject to a terminal disclaimer.

[21] Appl. No.: 08/854,290

[22] Filed: May 9, 1997

Related U.S. Application Data

[63] Continuation of application No. 08/509,035, Jul. 28, 1995, Pat. No. 5,629,644.

[51] Int. Cl.[7] ............................ H03K 3/023; H03K 5/13
[52] U.S. Cl. ...................... 327/393; 327/172; 327/132; 327/263
[58] Field of Search ................................ 327/394, 393, 327/172, 176, 291, 263, 392, 103, 131, 132, 134, 135, 101, 293, 298, 299, 227, 182; 323/315; 331/111, 143

[56] References Cited

U.S. PATENT DOCUMENTS

| | | | |
|---|---|---|---|
| 3,831,113 | 8/1974 | Ahmed | 327/132 |
| 3,906,247 | 9/1975 | Heffner | 307/293 |
| 4,359,649 | 11/1982 | Mundel | 307/268 |
| 4,584,494 | 4/1986 | Arakawa et al. | 327/176 |
| 4,607,328 | 8/1986 | Furukawa et al. | 395/250 |
| 4,608,530 | 8/1986 | Bacrania | 323/315 |
| 4,620,312 | 10/1986 | Yamashita | 327/176 |
| 4,812,687 | 3/1989 | Larson et al. | 327/263 |
| 4,981,358 | 1/1991 | McBrien et al. | 327/134 |
| 5,003,194 | 3/1991 | Engelhard | 307/265 |
| 5,047,664 | 9/1991 | Moyal | 307/303 |
| 5,130,582 | 7/1992 | Ishihara et al. | 327/392 |
| 5,233,315 | 8/1993 | Verhoeven | 331/45 |
| 5,345,196 | 9/1994 | Mahant-Shetti et al. | 327/101 |
| 5,352,934 | 10/1994 | Khan | 327/103 |
| 5,371,770 | 12/1994 | Sakuma | 327/291 |
| 5,387,882 | 2/1995 | Schoofs | 327/131 |
| 5,391,979 | 2/1995 | Kajimoto et al. | 323/313 |
| 5,455,522 | 10/1995 | Jones | 326/27 |
| 5,469,100 | 11/1995 | Wuidart et al. | 327/262 |
| 5,579,356 | 11/1996 | Chevallier . | |
| 5,581,206 | 12/1996 | Chevallier et al. | 327/143 |
| 5,592,111 | 1/1997 | Wong et al. | 327/291 |
| 5,629,644 | 5/1997 | Chevallier | 327/393 |
| 5,650,739 | 7/1997 | Hui et al. | 327/262 |
| 5,668,483 | 9/1997 | Roohparvar . | |
| 5,760,655 | 6/1998 | Roohparvar | 331/111 |
| 5,767,711 | 6/1998 | Chevallier et al. | 327/143 |

FOREIGN PATENT DOCUMENTS

5-122052 of 0000 Japan ........................ 326/81

*Primary Examiner*—Timothy P. Callahan
*Assistant Examiner*—Eunja Shin
*Attorney, Agent, or Firm*—Schwegman, Lundberg, Woessner & Kluth P.A.

[57] ABSTRACT

An adjustable timer circuit capable of producing accurate pulse outputs having a wide range of periods. The timer circuit includes a timing capacitor and an associated current source for producing a reference current having a magnitude which is derived from a reference voltage. A current divider is used to divide the reference current down to a smaller current used for charging the timing capacitor. A comparator circuit is provided for comparing the voltage produced across the timing capacitor with a comparison voltage also derived from the reference voltage. The timing capacitor is discharged in response to the comparator output so that subsequent output pulses can be produced. The current divider is adjustable in response to a mode control signal so that different magnitude charging currents can be produced which results in different magnitude pulse width outputs.

23 Claims, 6 Drawing Sheets

ADJUSTABLE TIMER CIRCUIT

This is a continuation of application Ser. No. 08/509,035, filed Jul. 28, 1995 now U.S. Pat. No. 5,629,644.

BACKGROUND OF THE INVENTION

1. Field of the Invention

The present invention relates generally to timer circuits and in particular to adjustable timer circuits which may be implemented completely in integrated circuit form and which is capable of providing relatively long duration timing pulses.

2. Background Art

In many integrated circuits, there is a requirement that certain functions be carried for a relatively precise time period. By way of example, in flash memory systems, the memory cells are programmed and erased by application of certain voltages to the flash memory cells for a fixed duration of time. A typical programming pulse may have a duration on the order of one microsecond. A typical erase pulse may have a duration on the order of one to a hundred milliseconds.

One conventional approach for generating pulses having durations which may vary three or more orders of magnitude is to generate a high frequency clock. This clock is used to produce the short duration programming pulses and a frequency divider circuit is used to divide the clock frequency down to provide the long duration pulses used in erasing. One disadvantage of this approach is that the frequency divider circuit must have a large number of stages to provide the desired long duration output pulses. In addition, many conventional timing circuits capable of being completely implemented in integrated circuit form do not provide the absolute accuracy often necessary in many applications such as flash memory systems.

The present invention pertains to an adjustable timer circuit which may be completely implemented in integrated circuit form and which has a relatively high absolute accuracy. In addition, the subject timer circuit is capable of providing a wide range of timing pulse outputs such as required in flash memory applications without resorting to a large frequency divider circuit. These and other advantages of the present invention will become apparent to those skilled in the art upon a reading of the following Detailed Description of the Invention together with the drawings.

SUMMARY OF THE INVENTION

A timer circuit is disclosed capable of producing output pulses having a wide range of durations. The timer circuit includes a timing capacitor and an associated current source means for producing a reference current having a magnitude derived from a reference voltage. A current divider means is included for producing a charging current in the timing capacitor having a magnitude which is equal to the magnitude of the reference current divided by N, where N is greater than one. The value of N is preferably adjustable for different modes of operation.

The timer circuit further includes comparator means for comparing a magnitude of a voltage produced across the timing capacitor by the charging current with a comparison voltage having a magnitude derived from the reference voltage and producing a comparator output based upon the comparison. Output means is included for producing the timer output in response to the comparator output. Typically, the output means includes a one shot for indicating the termination of the output pulse.

DETAILED DESCRIPTION OF THE INVENTION

Figure 1:
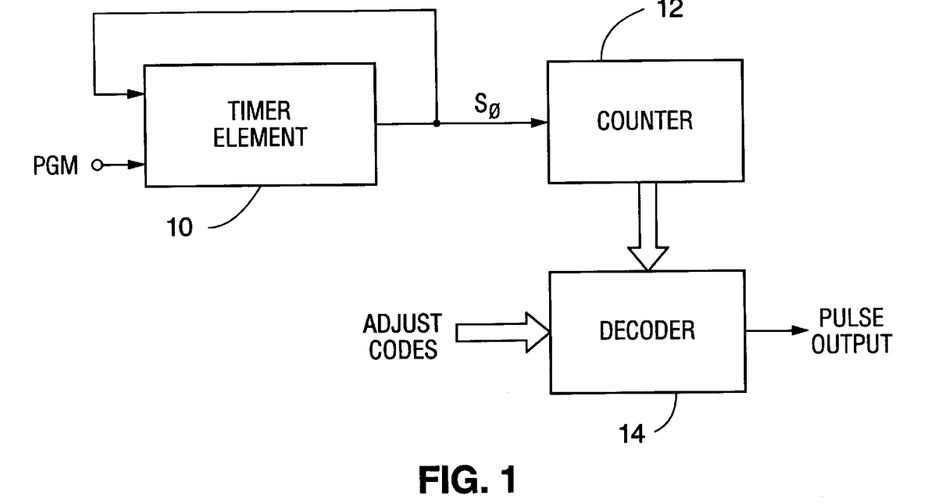
FIG. 1 is a block diagram of the subject timer circuit incorporated into a timer system.

Referring to the drawings, FIG. 1 is a block diagram of the subject adjustable timer circuit which is adapted for incorporation into a flash memory system. The timer circuit includes a timer element 10 for generating an output pulse $S_0$ which occurs a relatively precise time period after the timer circuit is triggered. The output pulse $S_0$ is fed back to an input of the timer element 10 so that the timer element can retrigger itself. In addition, the output pulse $S_0$ is used to clock a counter 12, with the counter having multiple outputs for driving a programmable decoder 14. The decoder 14 provides a pulse output, the duration of which is a function of certain stored parameters which control the decoder.

Timer element 10 is itself programmable based upon the memory operation to be performed. In the event a pulse is to be used to program a memory cell, program signal PGM will be active and cause the output $S_0$ to have a duration on the order of one to a hundred microseconds. In the event an erase operation is to take place, signal PGM will be inactive and the timer element $S_0$ will have a duration on the order of one to a hundred milliseconds.

Figure 2:
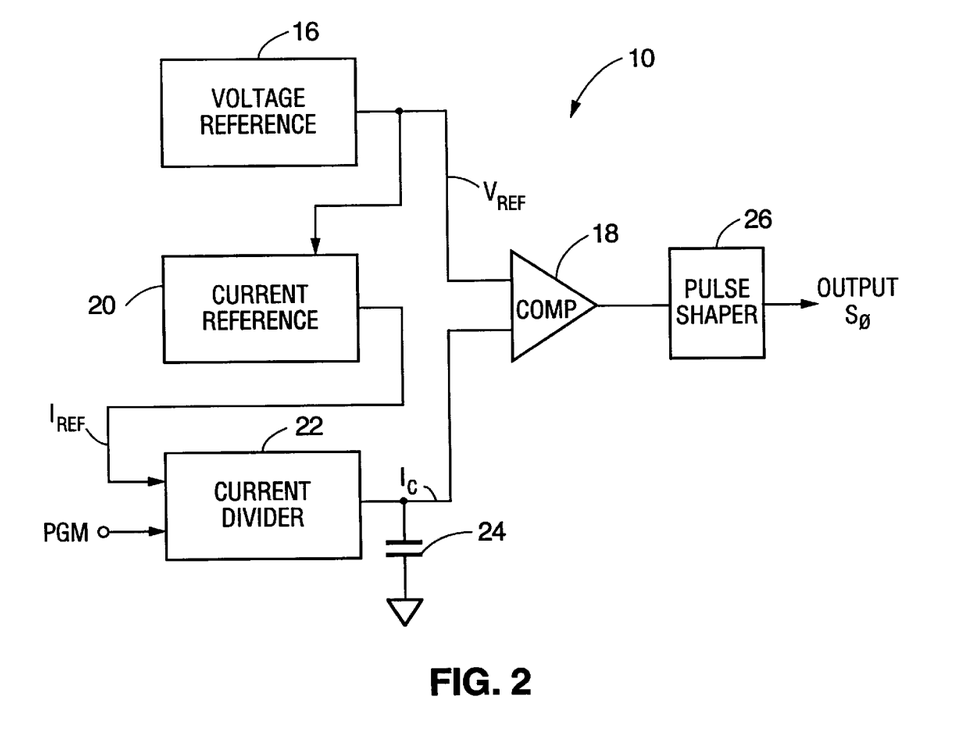
FIG. 2 is a block diagram of the subject timer circuit.

FIG. 2 shows additional details of the timer element 10 of FIG. 1. The timer element includes a voltage reference which produces a reference voltage $V_{REF}$ which is forwarded to a current reference stage 20. The current reference stage 20 produces a reference current $I_{REF}$ based upon the reference voltage $V_{REF}$ which is received by a current divider stage 22. The current divider provides an output current $I_C$, the magnitude of which is controlled by the program signal PGM which is used to charge a timing capacitor 24.

A comparator 18 is included which compares the voltage drop across timing capacitor 24 with the reference voltage $V_{REF}$. Current $I_C$ has a fixed magnitude which produces a ramp voltage across timing capacitor 24 with a fixed rate of change with respect to time. Thus, the duration of the pulse output of comparator 18 will be relatively constant and will be dependent essentially only on the value of $V_{REF}$ and the value of timing capacitor 24. The output of the comparator 18 is conditioned by pulse shaping circuitry 26 to provide the timer element output $S_0$.

Figure 3:
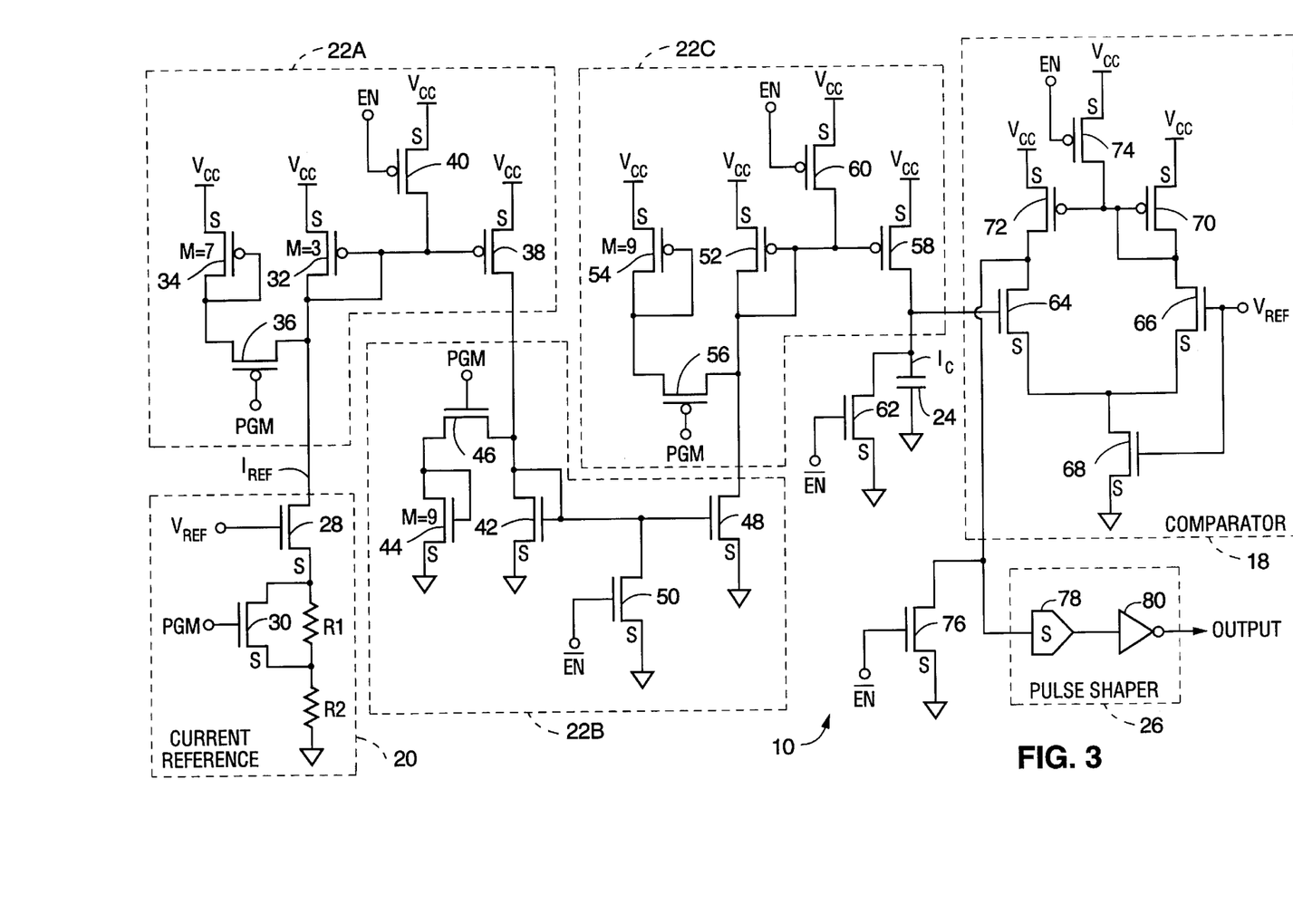
FIG. 3 is a detailed schematic diagram of the principal components of the subject timer circuit.

FIG. 3 shows additional details of the timer element 10. The current reference 20 receives the reference voltage $V_{REF}$ which is connected to the gate of an N channel transistor 28. The source of transistor 28 is connected to the series connection of resistors R1 and R2. A second N channel transistor 30 is connected across resistor R1 and has its gate connected to the program signal PGM. The voltage across resistors R1 and R2 is equal to the reference voltage $V_{REF}$, less the gate-source voltage of transistor 28. The magnitude of the reference current $I_{REF}$ is determined by the voltage across resistors R1 and R2 and the value of those resistors.

Voltage $V_{REF}$ may be generated by any suitable reference voltage generator circuit and is constant with respect to the power supply voltages of memory system, including primary supply voltage $V_{CC}$, and temperature and process variations. In order to make the gate-source voltage of transistor 28 to be close to the threshold voltage of that device, transistor 28 is made to be relatively large in terms of the ratio of the channel width to length (W/L). In addition, the magnitude of the reference current $I_{REF}$ through the transistor 28 is maintained at a relatively low value in the range of 0.1 milliamperes so that the gate-source voltage will approach the threshold voltage.

Resistors R1 and R2 are made to have relatively small resistances, in the range of 10 kohm to 20 kohm total resistance. Large value resistances have relatively long lengths compared to their widths and are susceptible to minor variations in width due to the so-called edge effect. This sensitivity is reduced by using smaller values of resistors where the total value of resistance is less susceptible to variations in width. The total resistance is made to be small since a wide resistor, which also has a large overall resistance, will occupy an unduly large amount of die area.

When the memory system is in a programming mode, signal PGM is high so that resistor R1 is effectively shorted out. This will cause the value of the reference current $I_{REF}$ to increase to a program reference current $I_{REFP}$. As will be explained, the high signal PGM will also change the operation of the current divider 22 so that the charge current $I_C$ in the program mode is further increased. The increase to the program reference current $I_{REP}$ in combination the increase in current due to the change in operation of the current divider 22, will cause the value of the charge current $I_C$ to increase thereby reducing the duration of the time period from the triggering of the timer element 10 to the generation of the pulse output $S_0$ during programming to a period on the order of one microsecond.

When the memory system is in the erase mode, signal PGM is low and transistor 30 is off. Thus, the effective resistance will be the sum of R1 and R2 and the value of the reference current $I_{REF}$ will be reduced to the erase reference current $I_{REPE}$. In addition, the operation of the current divider 22 will change so as to further decrease the charge current $I_C$. These two factors will cause the charge current $I_C$ to be reduced thereby increasing output pulse duration so that time period from the triggering of the timer element 10 to the generation of the pulse output $S_0$ is on the order of one millisecond.

The two reference currents $I_{REFP}$ and $I_{REFE}$ differ by only approximately 10% in magnitude, therefore the adjustment of inserting or deleting resistor R1 is only used as a trim feature. As will be explained, the large difference in the final timing capacitor 24 charging current when PGM is active versus inactive is achieved by way of the current divider 22.

As can be seen from the foregoing, it is desirable to make the reference current $I_{REF}$ small so that the pulse duration is large. However, it is difficult to fabricate a stable large resistance due to the aforementioned edge effect, without using a very large amount of die area. Accordingly, the reference current $I_{REF}$ as will be explained in greater detail, is further reduced by the current divider 22 (FIG. 2), with the current divider being programmable to provide a first charge current $I_{CP}$ during programming operations and a second charge current during non-programming operations, $I_{CE}$, such as erase. The current divider 22 is implemented so th at the program charge current $I_{CP}$ is equal to the reference current $I_{REFP}$ divided by one thousand during the programming mode. In addition, the divider 22 is implemented so that the erase charge current $I_{CE}$ is equal to the erase reference current $I_{REFE}$ divided by three. The current divider 22 of the timer element 10 includes a first stage 22A, a second stage 22B and a third stage 22C. Each of the current mirror stages includes a mirror input and a mirror output. The first stage 22A includes a mirror input comprising three identical P channel transistors connected in parallel (M=3) which are represented by transistor 32. Transistor 32 is connected as a diode with its drain and gate connected together and has its source connected to the primary supply voltage $V_{CC}$. The first stage 22A mirror input further includes seven identical P channel transistors (M=7) connected in parallel which are represented by transistor 34. Transistor 34 is also connected as a diode with the drain and gate connected together and the source connected to the primary supply voltage $V_{CC}$.

Transistors 32 and 34 have their drains coupled together by a P channel transistor 36 connected as a pass transistor. When the program signal PGM applied to the gate of transistor 36 is inactive (low), the transistor is on, effectively connecting the seven transistors 34 in parallel with the three transistors 32 so as to provide a mirror input of ten transistors. When PGM is active (high), the mirror comprises the three transistors 32. The ten individual transistors which make up transistors 32 and 34 are sometimes referred to as sub-transistors.

The mirror output of stage 22A includes a single P channel transistor 38 having its gate connected to the gates of transistors 32 and its source connected to the primary supply voltage. Transistor 38 is identical to the ten transistors which make up transistors 32 and 34. A P channel enable transistor 40 is connected between the gates of transistors 32 and 38 and the primary supply voltage $V_{CC}$. An enable signal EN is connected to the gate of transistor 40 which is active high. Thus, when the enable signal is active, transistor 40 is off and when it is inactive, transistor 40 is conductive thereby disabling current mirror stage 22A.

In operation, the input of current mirror stage 22A is caused to draw current $I_{REF}$ through the drain-sources of the three sub-transistors which make up transistor 32 by current reference 20 when program signal PGM is active (transistor 36 is off). This causes a corresponding gate-source voltage to be produced in transistors 32. This gate-source voltage is dropped across transistor 38 causing current $I_{REF}$ to be mirrored in that transistor. All of the four transistors 32 and 38 will draw the same amount of current, $I_{REF}/3$. Accordingly, the current out of the current mirror first stage 22A, the current flow through transistor 38 will be $I_{REF}/3$.

If the program signal PGM is inactive, thereby indicating an erase operation (among others), transistor 36 is conductive. In that event, reference current $I_{REF}$ will be equally divided among the ten sub-transistors which make up transistors 32 and 34 of the input. Thus, the current in the output transistor 38 will be equal to that of any one of the input transistors, namely, $I_{REF}/10$.

Thus, since the ten transistors 32 and 34 of the first current mirror stage 22A are of the same construction and have the same ratio of channel width to channel length, the input of the current mirror stage can be viewed as being a single transistor having an effective ratio of channel width to channel length which is can be precisely controlled relative to the ratio of channel width to channel length of the output transistor 38. Such precision is due, in part, to the fact that it is possible to make multiple transistors which are almost identical to one another. In one instance, when PGM is active (transistor 36 is off), the value of the input transistor ratio relative to the value of the output transistor ratio is precisely three to one. When PGM is inactive, transistor 36 is conductive and the value is precisely ten to one.

The output of the first stage 22A of the current divider (transistor 38) is connected to the input of the second current mirror stage 22B. The input of stage 22B includes a single N channel transistor 42 connected as a diode. Transistor 42 may be selectively connected in parallel by way of transistor 46 to nine (M=9) N channel sub-transistors 44, each also connected as a diode. Transistor 46 is controlled by the inverted program signal $\overline{PGM}$. Thus, when the program signal PGM is active, signal $\overline{PGM}$ is inactive (high) thereby turning on transistor 46 so that the mirror input comprises a total of ten identical transistors 42 and 44. When signal $\overline{PGM}$ is active (low), the mirror input comprises one transistor 42.

The mirror output of the second stage 22B is single transistor 48 having its gate connected to the gates of the transistors of the mirror input. An N channel transistor 50 is connected between the gates of transistors 42 and 48 and the circuit common and has its gate connected to the inverse of the enable signal EN, signal $\overline{EN}$. Thus, when the circuit is enabled, signal $\overline{EN}$ is low thereby causing transistor 50 to remain off, otherwise transistor 50 is conductive and functions to disable the second current mirror stage 22B.

Since transistors 42 and 48 are each single transistors and since transistor 44 comprises nine sub-transistor, the second stage functions to divide the input current to the second stage by either ten if the inverted program signal $\overline{PGM}$ is inactive (high) or by one if the signal is active.

The output of the second current mirror stage 22B, the drain of transistor 48, is connected to the input of the third mirror stage 22C. The input of the third stage includes the drain of single P channel transistor 52 and the drains of nine (M=9) P channel transistors 54 if transistor 56 is made conductive by an inactive program signal PGM. Single P channel transistor 58 forms the output of the third mirror stage. Thus, the third mirror stage will divide the input current by ten if the program signal PGM is active and will divide by one if the signal is active.

In summary, if the program signal PGM is inactive, the output of the current divider 22, current $I_{CE}$ is $I_{REFE}/1000$. If the program signal is active, the output of the current divider, current $I_{CP}$ is $I_{REFP}/3$. Currents $I_{CE}$ and $I_{CP}$ are used to charge timing capacitor 24. An N channel transistor 62 is connected across timing capacitor 24 and functions to hold the capacitor in a discharged stage when the inverted enable signal $\overline{EN}$ is inactive (high). When the signal $\overline{EN}$ is active, timing capacitor 24 is charged by the output current $I_C$ of the current divider, with $I_C$ being equal to either $I_{CE}$ or ICP depending upon whether the program signal PGM is active.

The timer element 10 further includes the comparator circuit 18. The voltage across timing capacitor 24 is connected to one input of the comparator circuit 18. Circuit 18 includes a pair of differentially-connected N channel input transistors 64 and 66. The common source connection of transistors 64 and 66 is connected to a tail current source in the form to an N channel transistor 68. Current source transistor 68 is biased by the reference voltage $V_{REF}$.

Comparator circuit 18 further includes a pair of P channel transistors 70 and 72 connected as current mirror loads for the input transistors 64 and 66. Transistor 70 has its gate and source connected together and to the gate of transistor 72 and to the drain of another P channel transistor 74, with the source of transistor 74 connected to supply voltage $V_{CC}$. The gate of transistor 74 is connected to the enable signal EN which is active high. Thus, when active, signal EN will turn transistor 74 off and when inactive, will turn transistor 74 on thereby disabling comparator circuit 18.

The reference voltage $V_{REF}$ is connected to the remaining input of the comparator circuit, the gate of transistor 66. Thus, when the voltage across timing capacitor 24 is less than $V_{REF}$, the output of the comparator circuit 18 at the common drains of transistors 64 and 72 is at a relatively high level and when the capacitor voltage is slightly higher than the reference voltage, the output of the comparator circuit 18 is at a relatively low level.

The output of comparator circuit 18 is connected to the input of pulse shaper circuit 26. Circuit 26 includes a Schmidt trigger circuit 78. When the output of the comparator circuit is at the high level, the output of trigger circuit 78 is at a low level. When the comparator circuit drops down to a first threshold voltage, the output of the trigger circuit goes high. The rate of change of the voltage across timing capacitor 24 is slow so that the comparator circuit 18 will be in the region where it is switching states for a significant amount of time. Any noise present on the comparator inputs at this point is likely to cause the comparator to switch states. The trigger circuit 78 provides a degree of hysteresis so as to increase immunity to noise. Circuit 78 is implemented so that the threshold voltage is increased from the first voltage to a higher second threshold voltage. This helps to prevent the trigger circuit 78 output from changing back to the low state due to noise on the system.

The trigger circuit 78 output is inverted by an inverter 80 so that the output of the timer element 10 is a falling edge. An N channel transistor 76 is connected between the input of the pulse shaper circuit 26 and circuit common. The gate of transistor 76 is connected to the inverted enable signal $\overline{EN}$ so that the input of the pulse shaper circuit 26 will be functional when the enable signal $\overline{EN}$ is present and grounded when it is not present.

Figures 4, 6:
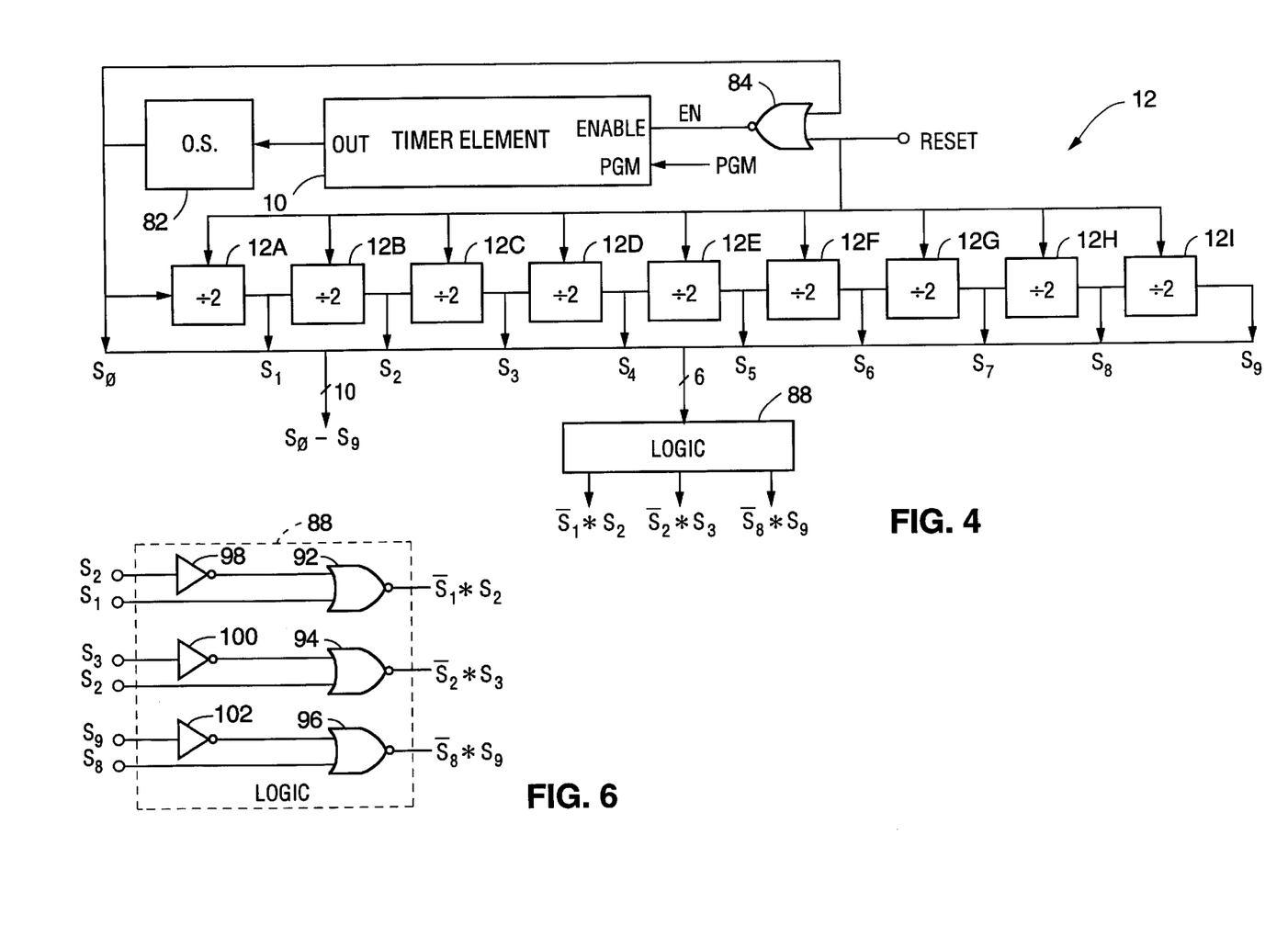
FIG. 4 is a detailed schematic diagram of the frequency divider and part of the decoder circuitry to be used in connection with the timer element of the present invention.
FIG. 6 is a detailed schematic diagram of part of the decoder circuit of the FIG. 4 diagram.

Referring to FIG. 4, the timer element 10 output is forwarded to a one shot circuit 82 which produces a short output pulse $S_0$ (typically 50 nanoseconds) on the falling edge of the timer element 10 output. Thus, signal $S_0$ is produced at the termination of each timer element 10 time period. When the timer element 10 is switched to the program mode (signal PGM is active), the output of the timer element 10 has a duration of 1.5 microseconds. When the timer element is in a non-program mode (signal PGM is inactive), the output of the timer element 10 has a duration of 0.4 milliseconds. This difference in three orders of magnitude is attributable the difference in the magnitude of the timing capacitor charging current $I_C$ for programming $I_{CP}$ and for non-programming $I_{CE}$. This difference is achieved by both the programmable current divider 22 (divide by 3 or divide by 1000) and the insertion and removal of resistor R1 from the current reference 20 (FIG. 3).

The output of the one shot 82 (FIG. 4) is fed back to the enable input of timer element 10 by way of a NOR gate 84. Thus, when signal $S_0$ is active (high), the enable signal EN goes momentarily inactive ($\overline{EN}$ active) thereby causing, among other things, transistor 62 (FIG. 3) to turn on. This will cause timing capacitor 24 to be discharged. Once the enable signal EN goes active at the end of the short duration pulse produced by one shot 82, the timer element will proceed to charge capacitor 24 again so that a further timer element 10 output will be produced. This process will continue unless the memory system generates a signal Reset which is applied to a second input of NOR gate 84 (FIG. 4). As long as signal Reset is present, signal enable EN will remain inactive (low) forcing the timer element to remain in a reset state.

The output of one shot 82, signal $S_0$, is coupled to the input of counter 12 (FIG. 4) which has nine stages 12A–12I. Each stage includes a D type flip-flop having an output connected back to the input so as to provide a divide-by-two function. The counter 12 thus produces nine timing outputs $S_1$–$S_9$ which are forwarded to various decoding circuitry. The counter 12 stages are each reset by signal Reset. The decoding logic includes a Logic element 88 which receives five of the timing signals ($S_1$, $S_2$, $S_3$, $S_8$ and $S_9$) from counter 12. The Logic elements logically combines the six timing signals to provide three decoded outputs including $\overline{S}_1 * S_2$, $\overline{S}_2 * S_3$ and $\overline{S}_8 * S_9$ (*=AND). As will be explained in greater detail, these outputs are selected to provide certain desired predetermined output pulse widths for carrying out memory operations such as programming.

FIG. 6 shows the implementation details of the Logic element 88. The element includes three NOR gates 92, 94 and 96 and three inverter. The six timing signals $S_N$ are coupled to the appropriate inputs to the logic gates to provide the three outputs. By way of example, timing signal $S_2$ is connected to inverter 98, the output of which is connected to one input of NOR gate 92. Timing signal $S_1$ is connected to the second input of the NOR gate 92 the output of which is signal $\overline{S}_1$ and $S_2$ ANDed together ($\overline{S}_1 * S_2$).

The exemplary memory system provides a total of three types of pulses used in memory operations. Pulses are provided for Programming operations and Erasing operations. In addition, pulses are provided for operations which are performed for the purpose of reducing the distribution of erased threshold voltages after an erase operation has been completed. This type of operation, sometimes referred to as a Heal operation, requires pulses having a duration on the order of those used in memory erase operations. Thus, the timer element 10 is placed in the non-program state (PGM inactive) when Heal operations are to be performed.

Figure 5:
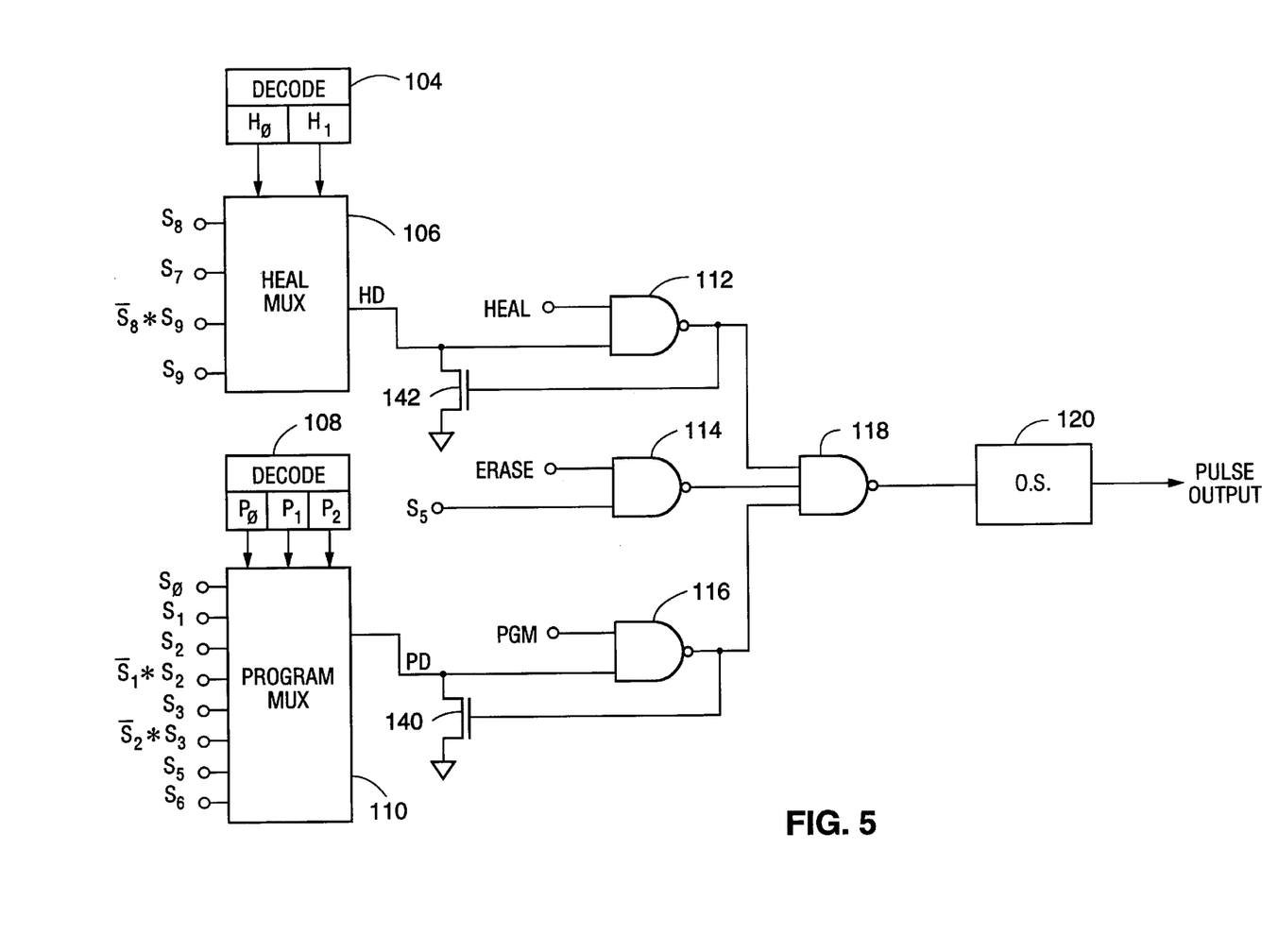
FIG. 5 is a more detailed schematic diagram of part of the decoding circuitry used in association with the subject timer circuit.

FIG. 5 depicts the circuitry for generating the particular pulses used in the Programming, Erasing and Heal memory operations. As will be explained, the duration of the individual pulses can be controlled in order to optimize the pulse width for the particular memory system. The memory Ease operation timing signal is not adjustable in the disclosed exemplary embodiment. Decode $S_5$, taken directly from stage 12E of counter 12, is connected to one input of a two-input NAND gate 114. The second input is connected to a signal ERASE which is active when a memory Erase operation is to be performed. The output of gate 114 is connected to one input of a three input NAND gate 118. The falling output of gate 114 functions to trigger a one shot 120 causing a 50 nanosecond pulse to be produced thereby indicating the end of the erase pulse. During an Erase operation, signal PGM is inactive so that the timer element 10 will output a pulse $S_0$ having a duration of 0.4 milliseconds. Decode $S_5$ will provide an output $2^5$ (32) times the period of the output pulse $S_0$ period of 0.4 milliseconds.

The Heal pulse widths are adjustable and can range from 50 milliseconds to 200 milliseconds. The particular pulse width is based upon the value of two bits of stored programmable parameters $H_0$ and $H_1$. Parameters $H_0$ and $H_1$ are preferably stored in two non-volatile flash memory cells represented by element 104. Table 1 below shows the four combinations of parameters $H_0$ and $H_1$ and the corresponding decodes and pulse durations. A Heal multiplexer 106 is used to select one of four possible decodes based upon the two parameters $H_0$ and $H_1$.

The output HD of Heal multiplexer 106 is connected to one input of two-input NAND gate 112. The second input to the NAND gate is a signal Heal which is produced by the memory system when the

TABLE 1

| DECODE (Heal) | | PULSE WIDTH |
|---|---|---|
| $H_0$ | $H_1$ | (milliseconds) |
| 0 | 0 | 100 [$S_8$] |
| 0 | 1 | 50 [$S_7$] |
| 1 | 0 | 150 [$\overline{S}_8 * S_9$] |
| 1 | 1 | 200 [$S_9$] | memory system is performing a Heal operation. The output of gate 112 is connected to a second input of three-input NAND gate 118. Thus, when signal Heal is active, one shot 120 is triggered by a selected one of the four possible Heal decodes.

The decode circuitry further includes a Program multiplexer 110 used to select one of eight possible decodes for use in memory program operations. The selected decode is based upon parameters $P_0$, $P_1$ and $P_2$ also preferably stored in three non-volatile memory cells represented by element 108. Table 2 below shows the eight combinations of parameters $P_0$, $P_1$ and $P_2$ and the corresponding output pulse widths used in memory programming operations.

TABLE 2

| DECODE (program) | | | PULSE WIDTH |
|---|---|---|---|
| $P_0$ | $P_1$ | $P_2$ | (microseconds) |
| 0 | 0 | 0 | 6 [$S_2$] |
| 0 | 0 | 1 | 4.5 [$\overline{S}_1 * S_2$] |
| 0 | 1 | 0 | 3 [$S_1$] |
| 0 | 1 | 1 | 1.5 [$S_0$] |
| 1 | 0 | 0 | 9 [$\overline{S}_2 * S_3$] |
| 1 | 0 | 1 | 12 [$S_3$] |
| 1 | 1 | 0 | 48 [$S_5$] |
| 1 | 1 | 1 | 96 [$S_6$] |

The output PD of the Program multiplexer 110 is connected to one input of a two-input NAND gate 116, with the second input being connected to receive an active signal PGM when the memory is to perform a program operation. The decode is forwarded by way of gate 118 to one shot 120 and triggers the one shot on its falling edge. Thus, depending upon the stored parameters $P_0$, $P_1$ and $P_2$, the program pulse outputs will vary as set forth in Table 2 above.

Figure 7:
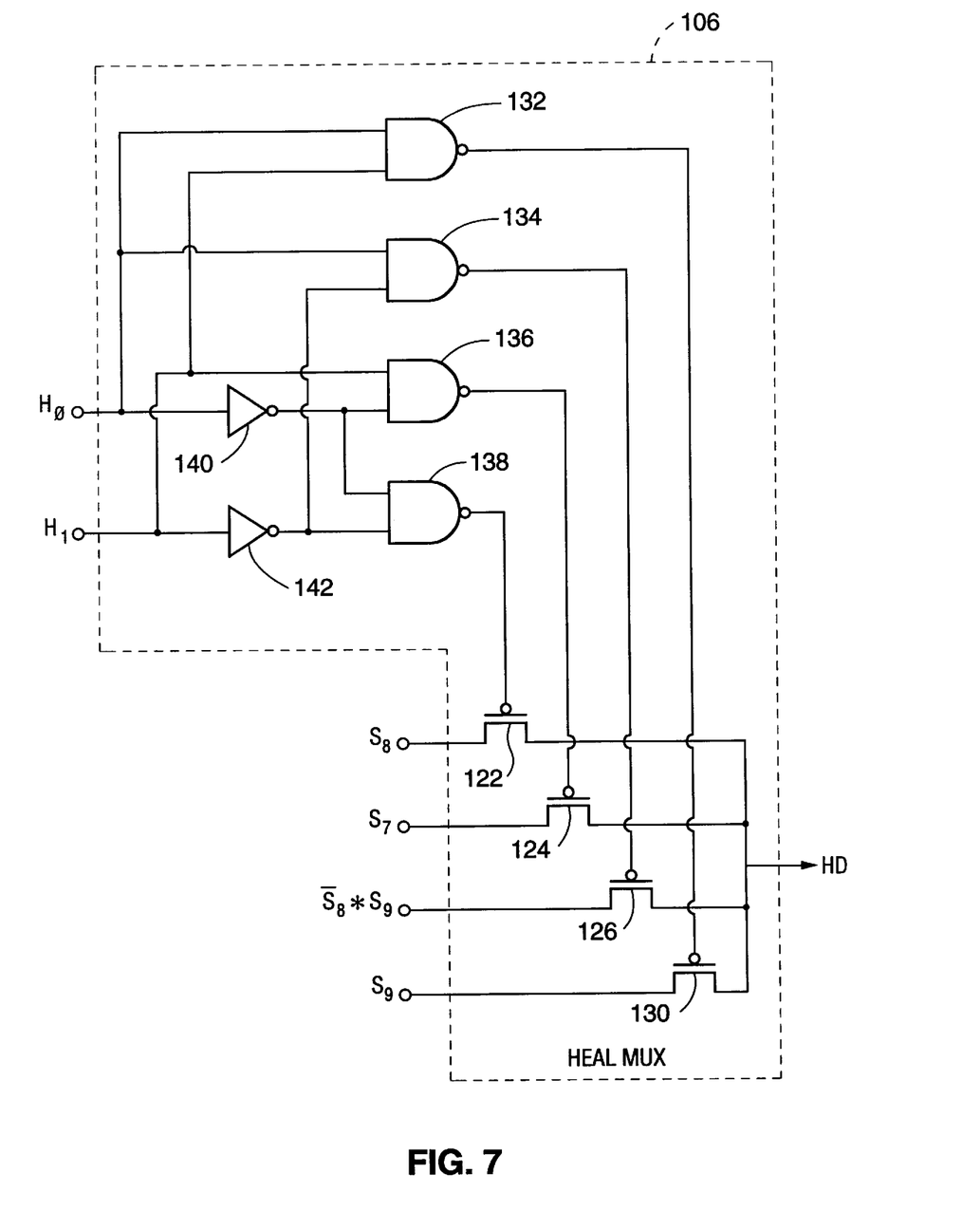
FIG. 7 is a detailed schematic diagram of one of the multiplexer circuits of the FIG. 5 diagram.

FIG. 7 shows a schematic diagram of the Heal multiplexer 106. The Program multiplexer 110 is implemented in a similar manner. The multiplexer 106 includes four P channel pass transistors 122, 124, 126 and 130 which are selectively enabled depending upon the stored parameters $H_0$ and $H_1$ so as to pass the selected decode to the output HD of the multiplexer. Four NAND gates 132, 134, 136 and 138 and two inverter 140 and 142 are used for decoding the parameters $H_0$ and $H_1$ and enabling one of the four NAND gates 132, 134, 136 and 138 based upon the parameters. By way of example, if the parameters Ho and $H_1$ are logic 0 and 1, respectively, both inputs to NAND gate 136 will be a logic 1 so that the logic 0 (low) output of gate 136 will turn pass transistor 124 on. Transistor 124 will forward decode $S_7$ to the multiplexer output HD. The other NAND gates 122, 126 and 130 will all have high (logic 1) outputs under these conditions.

When one or both of the multiplexers 106 and 110 are coupling a low logic level signal, the output of the multiplexers (HD or PD) will be at one threshold voltage above ground due to the fact that the pass transistors include only P channel devices rather than both P and N channel devices. Small geometry transistors 140 and 142 (FIG. 5) are provided for pulling the multiplexer outputs down to approximately ground level under these conditions so that the multiplexer outputs HD and PD are at the proper low level. Transistors 140 and 142 are rendered conductive by the high outputs of NAND gates 112 and 116, respectively, with the outputs of these gates being high when the outputs of the respective multiplexers 106 and 110 are at one threshold voltage above ground potential.

The Heal parameters $H_0$ and $H_1$ and the Program parameters $P_0$, $P_1$, and $P_2$ are selected so as to optimize the performance of the memory system. By way of example, a particular lot of memory integrated circuits may be such that the flash memory cells of the memory array can be most efficiently programmed by application of a pulse of 9 microsecond duration. This would typically be determined at the memory fabrication facility. In that event, the parameters $P_0$, $P_1$, and $P_2$ would be selected to be 1, 0 and 0, respectively as indicated by Table 2. These value will be permanently programmed into the three non-volatile flash memory cells at the fabrication facility. If, for example, preliminary evaluation of a subsequent lot of memory integrated circuits indicates that the optimum pulse duration for programming is 100 microseconds, all that is required is to program 1, 1 and 1 for parameters $P_0$, $P_1$ and $P_2$. respectively, as indicated by Table 2.

Figure 8:
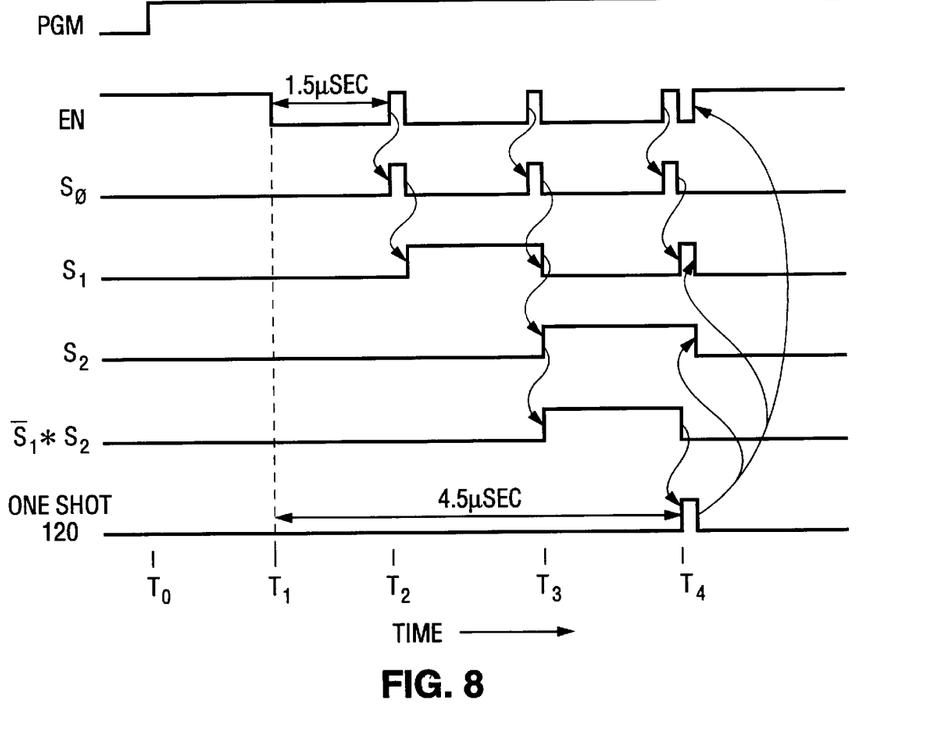
FIG. 8 is a timing diagram illustrating the operation of the timer element and an exemplary decoder output.

FIG. 8 is a timing diagram which further illustrates the operation of the subject invention. FIG. 8 shows the manner in which the 4.5 microsecond pulse is produced in a programming operation. As indicated in Table 2, the stored parameters $P_0$, $P_1$ and $P_2$ are 0, 0 and 1, respectively for producing a programming pulse of this duration. At time $T_0$, signal PGM is made active thereby indicating that one of programming outputs of Table 2 is to be produced. The stored parameters (block 108 of FIG. 5) will cause multiplexer 110 to select decode $\overline{S}_1 * S_2$.

At time $T_1$, signal $\overline{EN}$ is made active (low) by the generation of reset signal Reset (FIG. 4). The current mirror 22 begins to function and the transistor 62 (FIG. 3) which was shorting the timing capacitor 24 is turned off so that the capacitor will begin to be charged by current $I_{CP}$ and the voltage across the capacitor will begin to increase. This is the beginning of the generation of the 4.5 microsecond timing pulse, at which time the programming voltages are applied to the flash memory cell being programmed.

At time $T_2$, the voltage across the timing capacitor 24 is equal to the reference voltage $V_{REF}$. One shot circuit 82 will then issue a pulse in the form of signal $S_0$. Signal $S_0$ is fed back to the timer element by way of NOR gate 84 to generate a subsequent signal $\overline{EN}$. The time period from the falling edge of $\overline{EN}$ at time $T_0$ to the rising edge of the next signal $\overline{EN}$ (or the rising edge of signal $S_0$) is 1.5 microseconds. This sequence is periodically repeated so that subsequent signals $S_0$ are produced at time $T_3$, $T_4$, etc.

Signal $S_0$ clocks counter 12, with counter output $S_1$ changing states at the falling edge of signal $S_0$ thereby providing a signal with a nominal period of 3 microseconds as can be seen in the FIG. 8 diagram. Similarly, counter output $S_2$ changes state on the falling edge of output $S_1$ thereby providing a signal with a nominal period of 6 microseconds. The logical combination of $\overline{S}_1 * S_2$ is equivalent to subtracting 1.5 microseconds (signal $S_1$) from 6 microseconds (signal $S_2$) to arrive at the final 4.5 microsecond value. The falling edge of the decode $\overline{S}_1 * S_2$ out of multiplexer 110 triggers one shot 120 by way of gates 116 and 118. Thus, the rising edge of the one shot 120 (or the falling edge of decode $\overline{S}_1 * S_2$) represents the termination of the 4.5 microsecond time period.

Figure 9:
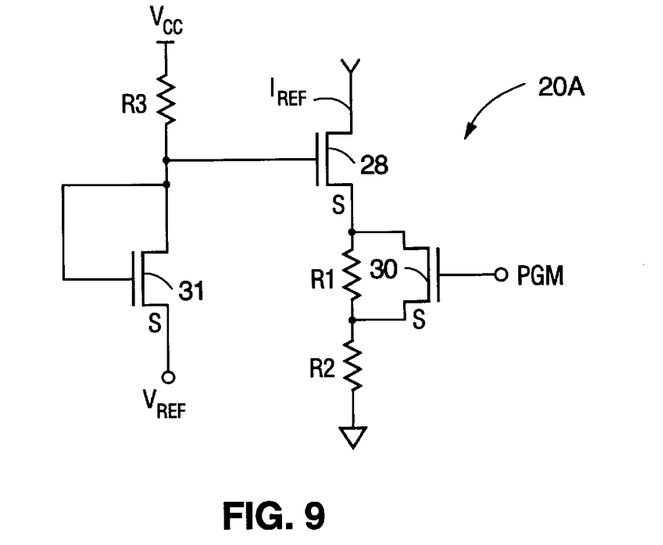
FIG. 9 is a schematic diagram of an alternative current reference circuit.

FIG. 9 depicts an alternative embodiment Current Reference 20A which provides a more stable reference current $I_{REF}$, The reference voltage is applied to the source of an N channel transistor 31, with transistor 31 having its drain and gate connected together. The drain of transistor 31 is connected to the primary supply voltage $V_{CC}$ by way of a resistor R3. The voltage at the gate/drain of transistor 31, which is equal to voltage $V_{REF}$ plus the threshold voltage of transistor 31, is applied to the gate of transistor 28. The voltage at the source of transistor 28 is equal to the gate voltage less the threshold voltage of transistor 28. Assuming that transistors 28 and 31 are the same size and conduct about the same amount of current, it can be seen that the threshold voltages cancel one another out so that the voltage across resistors R1 and R2 is equal to voltage $V_{REF}$. Thus, the reference current $I_{REF}$ through transistor 28 will be very stable and less sensitive to variations in transistor threshold voltages resulting from process variations and the like.

Thus, an adjustable timer circuit has been disclosed capable of providing a very wide range of accurate pulse widths has been disclosed. Although one embodiment has been described in some detail, it is to be understood that certain changes can be made without departing from the spirit and scope of the invention as defined by the appended claims.

I claim:

1. A memory device comprising:
   current reference circuitry to provide a reference current;
   a current divider circuit to divide the reference current by either a first divisor value or a second divisor value based upon a control signal;
   a capacitor coupled to receive the divided reference current;
   a compare circuit coupled to the capacitor and a reference voltage, the compare circuit having elements to provide a timing output signal;
   a counter circuit coupled to receive the timing output signal; and
   a decoder circuit coupled to the counter circuit to provide a pulsed output signal.

2. The memory device of claim 1 wherein the decoder circuit includes elements to provide pulsed output signals for use in a memory write operation, a memory read operation, and memory heal operations.

3. The memory device of claim 1 wherein the second divisor value is three orders of magnitude greater than the first divisor value.

4. The memory device of claim 1 wherein the second divisor value is 1,000 and the first divisor value is 3.

5. A memory device comprising:
current reference circuitry to provide a reference current;
a current divider circuit to divide the reference current by either a first divisor value or a second divisor value based upon a control signal;
a capacitor coupled to receive the divided reference current;
a compare circuit coupled to the capacitor and a reference voltage, the compare circuit having elements to provide a timing output signal; and
wherein the current reference circuitry includes a fine tune circuit to adjust the reference current, the fine tune circuit comprising a plurality of series coupled resistors, and bypass circuitry to electrically bypass at least one of the plurality of series coupled resistors.

6. The memory device of claim 5 wherein the fine tune circuit further comprises a transistor coupled in series with the plurality of series coupled resistors, the transistor being activated in response to a second reference voltage provided on a control terminal of the transistor.

7. The memory device of claim 6 wherein the second reference voltage is coupled to the control terminal via a voltage divider circuit.

8. A memory device comprising:
current reference circuitry to provide a reference current;
a current divider circuit to divide the reference current by either a first divisor value or a second divisor value based upon a control signal;
a capacitor coupled to receive the divided reference current;
a compare circuit coupled to the capacitor and a reference voltage, the compare circuit having elements to provide a timing output signal; and
wherein the current divider circuit divides the reference current by selectively activating a plurality of parallel coupled transistors.

9. A memory device comprising:
a timing capacitor;
a compare circuit coupled to the timing capacitor to compare a voltage stored on the timing capacitor with a reference voltage;
a pulse shaper circuit to condition an output signal from the compare circuit;
means for providing multiple charging currents to the timing capacitor;
means for generating a plurality of timing outputs from the output signal; and
means for decoding the timing outputs to generate a pulse having a selected width.

10. The memory device of claim 9 wherein the multiple charging currents are separated by at least three orders of magnitude.

11. A non-volatile memory device comprising:
an array of non-volatile memory cells; and
a timer circuit to generate a pulse for the array having a selected width, the timer circuit comprising;
a current source to provide a reference current based upon a reference voltage;
a current divider circuit coupled to divide the reference current by either a first divisor value or a second divisor value based upon a control signal;
a timing capacitor coupled to the current divider circuit to store a charge in response to the divided reference current; and
a comparator circuit coupled to compare the charge on the timing capacitor with the reference voltage.

12. The non-volatile memory device of claim 11, further comprising a counter circuit coupled to receive an output signal from the comparator circuit and to provide a plurality of output counter signals.

13. The non-volatile memory device of claim 12, further comprising a decoder circuit to decode the plurality of output counter signals and to provide timing signals for read, write and heal operations of the non-volatile memory device.

14. The non-volatile memory device of claim 11 wherein the reference voltage does not vary with variations in a primary supply voltage.

15. A method of operating an integrated memory device, the method comprising:
generating a first capacitor charging current for charging a timing capacitor in a first operating mode;
generating a second capacitor charging current for charging the timing capacitor in a second operating mode, the second capacitor charging current being less than the first capacitor charging current;
generating timing signals in response to charging the timing capacitor in either the first or second operating mode; and
decoding the timing signals to generate a pulse having a selected width.

16. The method of claim 15 further comprising:
generating a reference current in response to a reference voltage which is relatively independent of variations in a primary supply voltage.

17. The method of claim 16 wherein the first capacitor charging current is generated by dividing the reference current by three.

18. The method of claim 16 wherein the second capacitor charging current is generated by dividing the reference current by 1,000.

19. The method of claim 18 wherein the second capacitor charging current is generated by dividing the reference current using three series coupled current mirror circuits, wherein each mirror circuit provides an output current which is one-tenth of an input current.

20. The method of claim 15 wherein the second capacitor charging current is three orders of magnitude less than the first capacitor charging current.

21. A method of operating an integrated memory circuit comprising:
initiating a program operation;
providing a first timing capacitor charging current during the program operation;
generating a plurality of program timing signals in response to the first timing capacitor charging current;
decoding the program timing signals to generate a program pulse having a selected width;
initiating an erase operation;
providing a second timing capacitor charging current during the erase operation;
generating a plurality of erase timing signals in response to the second timing capacitor charging current; and
decoding the erase timing signals to generate an erase pulse having a selected width.

22. The method of claim 21 further comprising:

initiating a heal operation;

providing the second timing capacitor charging current during the heal operation;

generating a plurality of heal timing signals in response to the second timing capacitor charging current; and decoding the heal timing signals to generate a heal pulse having a selected width.

23. The method of claim 21 wherein the second timing capacitor charging current is at least three orders of magnitude less than the first timing capacitor charging current.

* * * * *